(12) United States Patent
Kim

(10) Patent No.: US 7,202,724 B2
(45) Date of Patent: Apr. 10, 2007

(54) PULSE-BASED FLIP-FLOP

(75) Inventor: Min-Su Kim, Gyeonggi-do (KR)

(73) Assignee: Samsung Electronics Co., Ltd, Gyeonggi-do (KR)

( * ) Notice: Subject to any disclaimer, the term of this patent is extended or adjusted under 35 U.S.C. 154(b) by 99 days.

(21) Appl. No.: 10/997,958

(22) Filed: Nov. 29, 2004

(65) Prior Publication Data

US 2005/0116756 A1    Jun. 2, 2005

(30) Foreign Application Priority Data

Nov. 27, 2003 (KR) ............ 10-2003-0084965
Mar. 17, 2004 (KR) ............ 10-2004-0018004

(51) Int. Cl.
*H03K 3/286* (2006.01)
*H03K 3/356* (2006.01)
*H03K 3/00* (2006.01)
*G06F 1/04* (2006.01)

(52) U.S. Cl. ................ 327/218; 327/291; 327/299

(58) Field of Classification Search .......... None
See application file for complete search history.

(56) References Cited

U.S. PATENT DOCUMENTS

| 5,324,996 | A | * | 6/1994 | Mote, Jr. ............... 326/21 |
| 5,440,182 | A | | 8/1995 | Dobbelaere |
| 5,498,989 | A | * | 3/1996 | Diba ..................... 327/230 |
| 5,612,632 | A | * | 3/1997 | Mahant-Shetti et al. ...... 326/46 |
| 5,742,192 | A | * | 4/1998 | Banik .................... 327/166 |
| 6,181,182 | B1 | * | 1/2001 | Stotz et al. .............. 327/256 |
| 6,608,513 | B2 | | 8/2003 | Tschanz et al. |
| 2004/0075480 | A1 | | 4/2004 | Ahn |
| 2004/0135611 | A1 | * | 7/2004 | Tohsche ................. 327/218 |
| 2005/0232052 | A1 | * | 10/2005 | Jin ....................... 365/226 |

FOREIGN PATENT DOCUMENTS

| JP | 60-254740 | * 12/1985 |
| JP | 6-204812 | 7/1994 |
| JP | 2000-307394 | 11/2000 |
| JP | 2001-312328 | 11/2001 |

OTHER PUBLICATIONS

European Search Report dated Mar. 17, 2005.

* cited by examiner

*Primary Examiner*—Tuan T. Lam
(74) *Attorney, Agent, or Firm*—Harness, Dickey & Pierce, P.L.C.

(57) ABSTRACT

A pulse-based flip-flop that latches a data input signal to convert the data input signal into a data output signal in response to a clock signal. The pulse-based flip-flop comprises a latch that latches the data input signal in response to a first clock pulse signal and a second clock pulse signal and a pulse generator including a NAND gate, a variable delay, and a first inverter, the pulse generator receives the clock signal to generate the first clock pulse signal and the second clock pulse signal. The NAND gate receives the clock signal and an output signal of the variable delay and outputs the second clock pulse signal. The first inverter receives the first clock pulse signal and outputs the second clock pulse signal. The variable delay receives the clock signal and the second clock pulse, and an output signal of the variable delay feeds back to the NAND gate.

38 Claims, 11 Drawing Sheets

ND gate; a second inverter for receiving the output of the variable delay circuit; and a
PULSE-BASED FLIP-FLOP

PRIORITY STATEMENT

This application claims priority of Korean Patent Application Nos. 2003-84965, filed on Nov. 27, 2003 and 2004-18004, filed on Mar. 17, 2004, in the Korean Intellectual Property Office, the disclosure of which is incorporated herein in its entirety by reference.

BACKGROUND OF THE INVENTION

1. Field of the Invention

The present invention relates to a pulse-based flip-flop.

2. Description of the Related Art

Flip-flops and latches may be used as data storage devices in integrated semiconductor circuits. A flip-flop may sample an input signal and convert the input signal into an output signal based upon an clock signal. A latch may differ from a flip-flop in its signal processing in that the latch may continuously sample an input signal and may convert the input signal into an output signal based on clock pulses that it may receive. FIG. 1 illustrates a block diagram of a conventional pulse-based flip-flop. The pulse-based flip-flop 100 may include of a latch 110 for converting input data DIN into output data DOUT in response to a first clock pulse signal and a second clock pulse signal ~φ and φ generated by a pulse generator 120. The pulse-based flip-flop 100 may have an ideal operating speed and power consumption characteristics because the pulse-based flip flop may use a single latch 110 unlike a master-slave flip-flop, which may be constructed with two latches, a master latch and a slave latch, each of which may be composed of at least four gates. Referring to FIG. 2, the pulse generator 120 of the pulse-based flip-flop 100 may include three serially connected inverters, 122, 124, and 126. The first inverter 122, which may receive a clock signal CLOCK, an NAND gate 128, which may receive the clock signal CLOCK and an output signal of the third inverter 126, and may output a first clock pulse signal ~φ. A fourth inverter 130, which may receive the output of the NAND gate 128, may output a second clock pulse signal φ. The delay time of the first, second, and third inverters, 122, 124 and 126, may determine the pulse widths of the first and second clock pulse signals ~φ and φ.

However, the pulse generator 120 may have a large chip area and/or a higher power consumption than conventional latches which may be used in flip-flops because the pulse generator may be composed of more than four gates. The high power consumption and/or large chip area may not be ideal when a pulse-based flip-flop is used in a circuit with high-speed operation and/or low power consumption.

SUMMARY OF THE INVENTION

Exemplary embodiments of the present invention provide a pulse-based flip-flop that may include a pulse generator and/or a latch composed of a smaller number of gates than conventional pulse generators. Exemplary embodiments provide a pulse-based flip-flop with reduced power consumption and/or chip area in comparison with conventional pulse-based flip flops.

An exemplary embodiment of the pulse-based flip-flop may include a latch for latching a data input signal in response a first clock pulse signal and a second clock pulse and a pulse generator for receiving a clock signal for generating the first clock pulse signal and the second clock pulse signal.

According to an embodiment of the present invention, a pulse generator includes a NAND gate for receiving a clock signal and an output of a variable delay circuit, and outputs a first clock pulse signal; a first inverter for receiving the output of the NAND gate and outputs the second clock pulse signal; the variable delay circuit for receiving the clock signal and the output of the first inverter and feeds an output signal back to the NAND gate; a second inverter for receiving the output of the variable delay; and an NMOS transistor that may be connected between the output of the variable delay and a ground voltage, and gated to an output of the second inverter.

According to another embodiment of the present invention, a pulse generator comprising a NAND gate for receiving a clock signal and an output of a variable delay circuit, and outputting a first clock pulse signal, a first inverter for receiving an output of the NAND gate and outputs a second clock pulse signal; the variable delay circuit for receiving the clock signal and the output of the first inverter, and feeds an output signal back to the NAND gate; a second inverter for receiving the output of the variable delay; a first NMOS transistor having a drain connected to the output of the variable delay circuit and a gate for receiving a clock signal; and a second NMOS transistor having a drain connected to the source of the first NMOS transistor, a gate connected to an output of the second inverter and a source connected to a ground voltage.

According to another embodiment of the present invention, a pulse generator comprising a NAND gate for receiving a clock signal, an enable signal and a output of a variable delay circuit, and outputting a first clock pulse signal; a first inverter for receiving the output of the NAND gate and outputs a second clock pulse signal; the variable delay circuit for receiving the clock signal and the output of the first inverter, and feeds an output signal back to the NAND gate; a second inverter for receiving the output of the variable delay circuit; and an NMOS transistor having a source connected to the output of the variable delay circuit, a drain connected to a ground voltage and a gate connected to an output of the second inverter.

According to another embodiment of the present invention, a pulse generator comprising a NAND gate for receiving a clock signal, an enable signal and an output of a variable delay circuit, and outputting a first clock pulse signal; a first inverter for receiving the output of the NAND gate and outputting a second clock pulse signal; the variable delay circuit for receiving the clock signal and an output of the first inverter, and feeds the output signal back to the NAND gate; a second inverter for receiving the output of the variable delay circuit; a first NMOS transistor having a drain connected to the output of the variable delay circuit and a gate for receiving the clock signal; and a second NMOS transistor having a drain connected to a source of the first NMOS transistor, a gate connected to an output of the second inverter and a source connected to a ground voltage.

According to another embodiment of the present invention, a pulse generator comprising a NOR gate for receiving a clock signal and an output of a variable delay circuit and outputting a first clock pulse signal; a first inverter for receiving the output of the NOR gate and outputs a second clock pulse signal; the variable delay circuit for receiving the clock signal and an output of the first inverter, and feeds the output signal back to the NAND gate; a second inverter for receiving the output of the variable delay circuit; and a PMOS transistor having a drain for receiving the output of the variable delay circuit, a source for receiving a power supply voltage, and a gate for receiving an output of the second inverter.

According to another embodiment of the present invention, a pulse generator comprising a NOR gate for receiving a clock signal and an output of a variable delay circuit and outputs a first clock pulse signal; a first inverter for receiving the output of the NOR gate and outputting a second clock pulse signal; the variable delay for receiving the clock signal and the output of the first inverter, and feeds the output signal back to the NAND gate; a second inverter for receiving the output of the variable delay circuit; a first PMOS transistor having a drain connected to the output of the variable delay circuit and a gate for receiving the clock signal; and a second PMOS transistor having a drain connected to a source of the first PMOS transistor, a gate connected to an output of the second inverter and a source connected to a power supply voltage.

According to another embodiment of the present invention, a pulse generator comprising a NOR gate for receiving a clock signal, an enable signal and an output of a variable delay circuit and outputs a first clock pulse signal; a first inverter for receiving the output of the NOR gate and outputs a second clock pulse signal; the variable delay for receiving the clock signal and an output of the first inverter, and feeds the output signal back to the NAND gate; a second inverter for receiving the output of the variable delay circuit; and a PMOS transistor having a drain connected to the output of the variable delay circuit, a source connected to a power supply voltage, and a gate connected to an output of the second inverter.

According to an eighth embodiment of the present invention, a pulse generator comprising a NOR gate for receiving a clock signal, an enable signal and a output of a variable delay circuit and outputting a first clock pulse signal; a first inverter for receiving the output of the NOR gate and outputs a second clock pulse signal; the variable delay circuit for receiving the clock signal and an output of the first inverter, and feeds the output signal back to the NAND gate; a second inverter for receiving the output of the variable delay circuit; a first PMOS transistor having a drain connected to the output of the variable delay circuit and a gate for receiving the clock signal; and a second PMOS transistor having a drain connected to a source of the first PMOS transistor, a gate connected to an output of the second inverter, and a source connected to a power supply voltage.

According to exemplary pulse generator embodiments of the present invention, the number of gates constructing the flip-flop circuit may be reduced compared to a conventional pulse generator. Because there are less gates, power consumption and chip area of the circuit may be decreased.

BRIEF DESCRIPTION OF THE DRAWINGS

The present invention will become readily apparent from the description of the exemplary embodiments that follows, with reference to the attached drawings in which.

DETAILED DESCRIPTION OF EXEMPLARY EMBODIMENTS OF THE INVENTION

Exemplary embodiments of the present invention are shown and described, with reference to the attached drawings. As will be realized, the invention can be modified in various obvious respects, departing from the spirit and scope of the invention. Accordingly, the drawings and description are to be regarded as illustrative in nature, and not restrictive.

Figure 3:
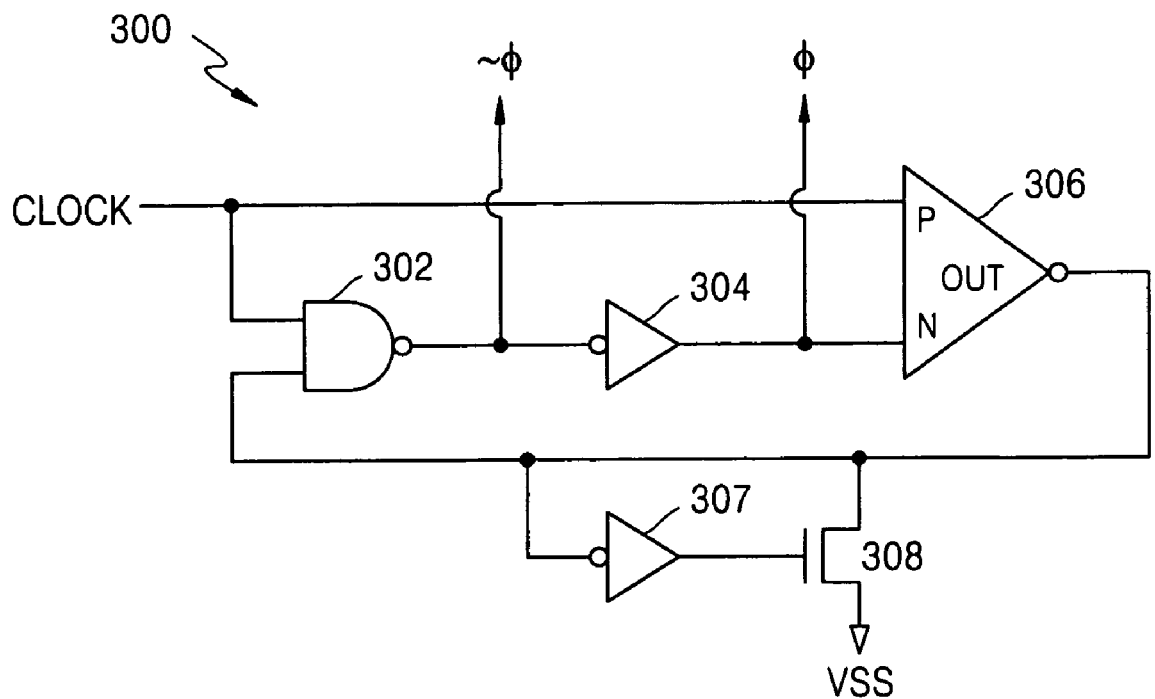
FIG. 3 a circuit diagram illustrating a pulse generator according to an exemplary embodiment of the present invention.

FIG. 3 illustrates a circuit diagram of a pulse generator according to an exemplary embodiment of the present invention. The pulse generator 300 may generate a first clock pulse signal and second clock pulse signal ~φ and φ in response to a clock signal CLOCK. The pulse generator 300 may include a NAND gate 302 which may receive the clock signal CLOCK and an output of a variable delay circuit 306; a first inverter 304 which may receive an output of the NAND gate 302; and the variable delay 306 which may receive the clock signal CLOCK and an output of the first inverter 304. The output of the NAND gate 302 may become the first clock pulse signal ~φ and the output of the first inverter 304 may become the second clock pulse signal φ.

The pulse generator 300 may further include a second inverter 307 and an NMOS transistor 308. The second inverter 307 which may receive an output of the variable delay circuit 306, and an output of the second inverter 307. The output of the second inverter may be applied to a gate of the NMOS transistor 308. A drain of the NMOS transistor may be connected to the output of the variable delay circuit 306, and a source of the NMOS transistor may be connected to a ground voltage VSS. The second inverter 307 and the NMOS transistor 308 may prevent the output of the variable delay 306 from floating when the logic level of the clock signal CLOCK may be high.

The pulse generator 300 may be composed of three gates. Accordingly, the number of gates constructing the circuit may be reduced. Therefore, the power consumption and/or chip area of the circuit may be decreased.

A variable delay 306 may be constructed in various ways. A variety of examples of the variable delay are illustrated in FIGS. 4, 5, 6, 7, and 8. The variable delays 306 may include an input terminal P which may receive the clock signal CLOCK, an input terminal N for accepting an output of the inverter 304, and/or an output terminal OUT.

Figure 4:
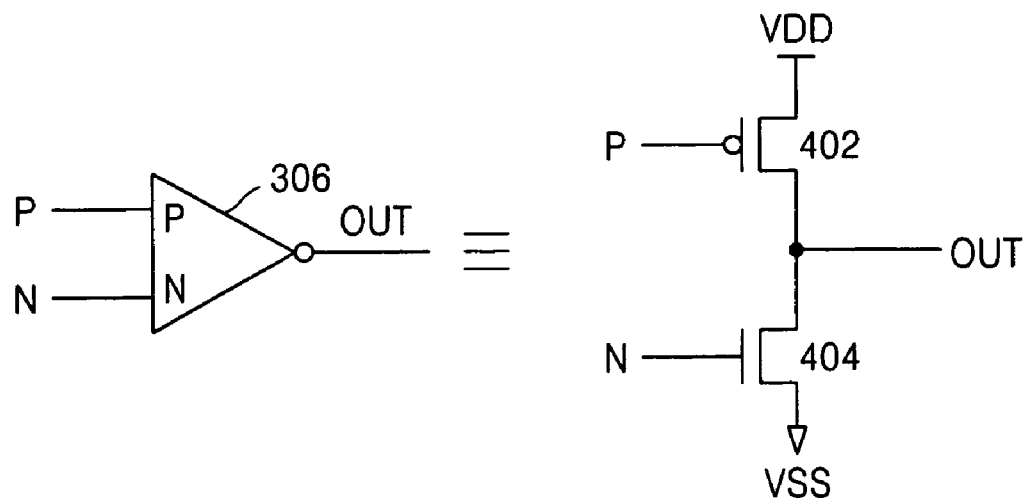
FIGS. 4, 5, 6, 7 and 8 are circuit diagrams illustrating an example of a variable delay circuits which may be used in the pulse generator of FIG. 3.

The variable delay 306 illustrated in FIG. 4 may include a PMOS transistor 402 and an NMOS transistor 404 both of which may be serially connected between a power supply voltage VDD and a ground voltage VSS. A gate of the PMOS transistor 402 may serve as an input terminal P, a gate of the NMOS transistor 404 may correspond to an input terminal N, and a drain of the PMOS and a drain of the NMOS may be connected to an output terminal OUT.

Figure 5:
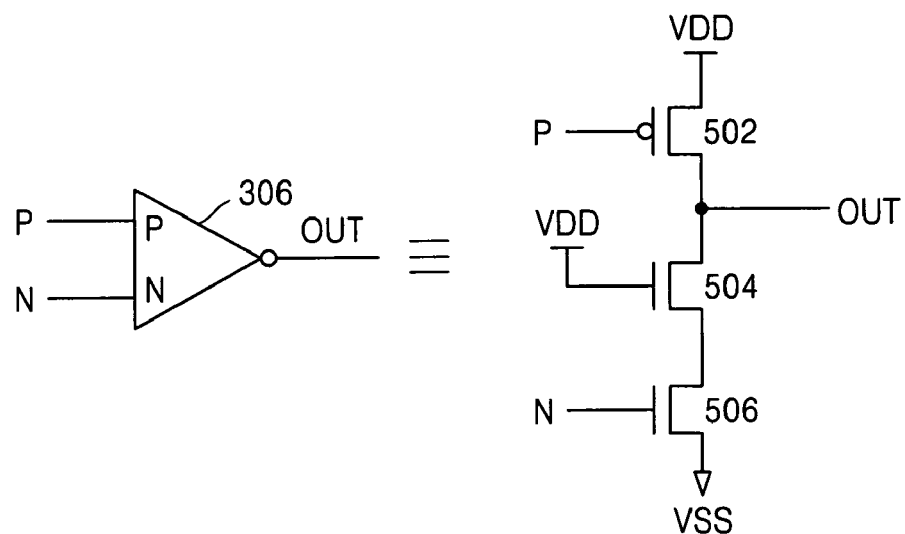

The variable delay 306 illustrated in FIG. 5 may include a PMOS transistor 502, a first NMOS transistor, and a second NMOS transistor 504 and 506 both of which may be serially connected between a power supply voltage VDD and a ground voltage VSS. A gate of the PMOS transistor 502 may serve as an input terminal P and a gate of the second NMOS transistor 506 may be connected to an input terminal N. A drain of the PMOS transistor 502 and a drain of the first NMOS transistor 504 may be connected to an output terminal OUT. The gate of the first NMOS transistor 504 may be coupled to a power supply voltage VDD.

Figure 6:
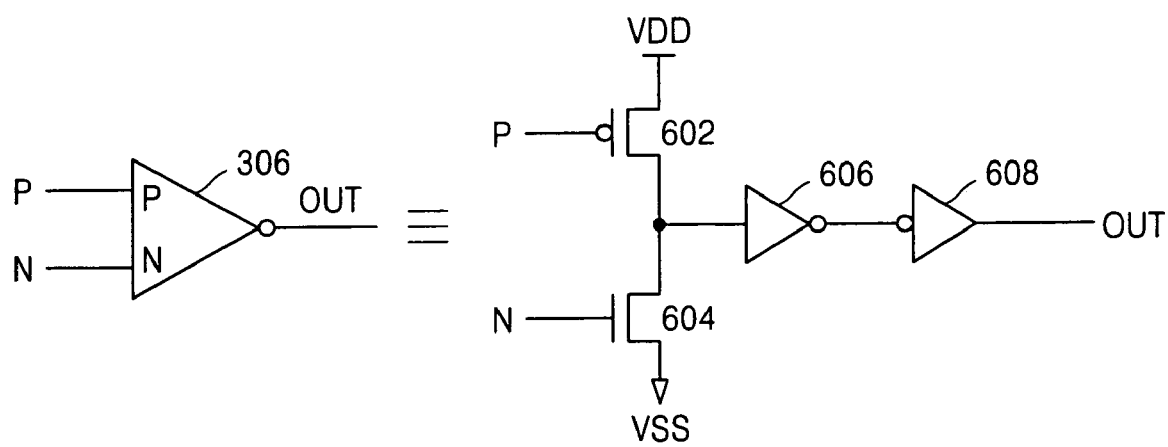

The variable delay 306 illustrated in FIG. 6 may include a PMOS transistor 602 and an NMOS transistor 604 both of which may be serially connected between a power supply voltage VDD and a ground voltage VSS. A drain of the PMOS transistor 602 and a drain of the NMOS transistor may be connected to an input of a first inverter 606. An output of the first inverter 606 may be connected to an input of a second inverter 608. A gate of the PMOS transistor 602 may serve as an input terminal P, a gate of the NMOS transistor 604 may correspond to an input terminal N, and an output of the second inverter 608 may be connected to an output terminal OUT.

Figure 7:
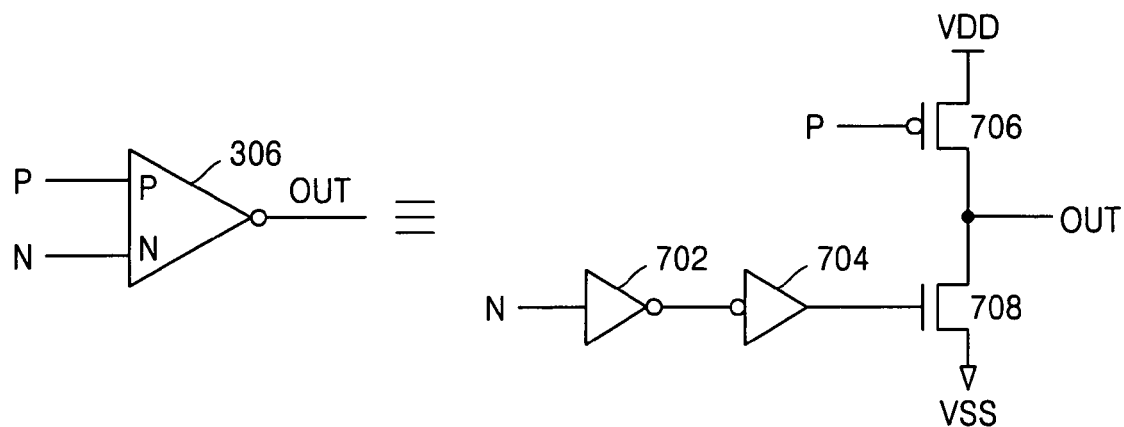

The variable delay 306 illustrated in FIG. 7 may include a first inverter 702 and a second inverter 704 may be serially connected to an input terminal N. A PMOS transistor 706 and an NMOS transistor 708 may be connected between a power supply voltage VDD and a ground voltage VSS. A gate of the PMOS transistor 706 may serve as an input terminal P and a drain of the PMOS transistor 706 and a drain of the NMOS transistor 708 may be connected to an output terminal OUT. A gate of the NMOS transistor 708 may be connected to an output of the second inverter 704.

Figure 8:
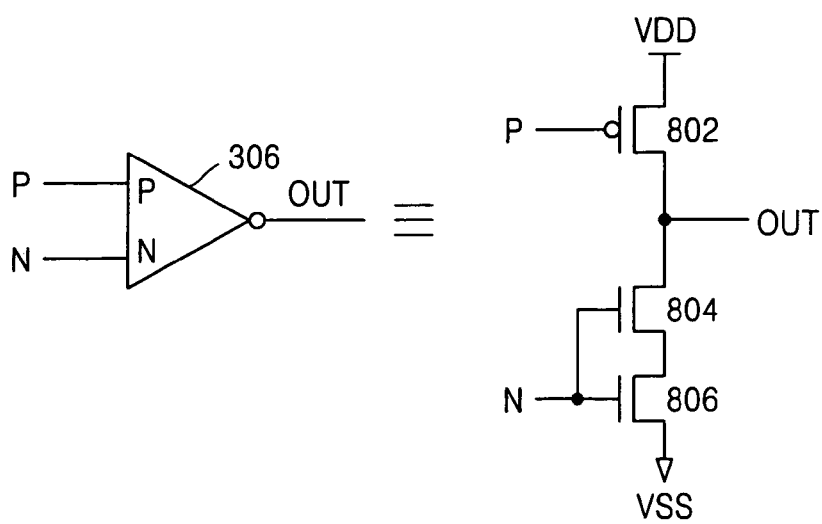

The variable delay 306 illustrated in FIG. 8 may include a PMOS transistor 802 and first and second NMOS transistors 804 and 806 both of which may be serially connected between a power supply voltage VDD and a ground voltage VSS. A gate of the PMOS transistor 802 may serve as an input terminal P and gates of the first and second NMOS transistors 804 and 806 may serve as inputs for a terminal N. A drain of the PMOS transistor 802 and a drain of the first NMOS transistor 804 may be connected to an output terminal OUT.

Figure 1:
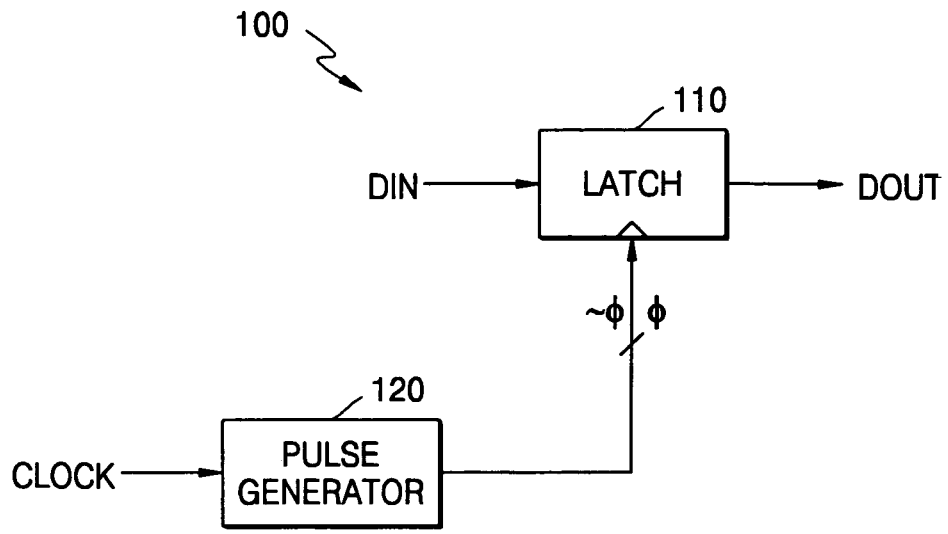
FIG. 1 illustrates a block diagram of a conventional pulse-based flip-flop.
Figure 2:
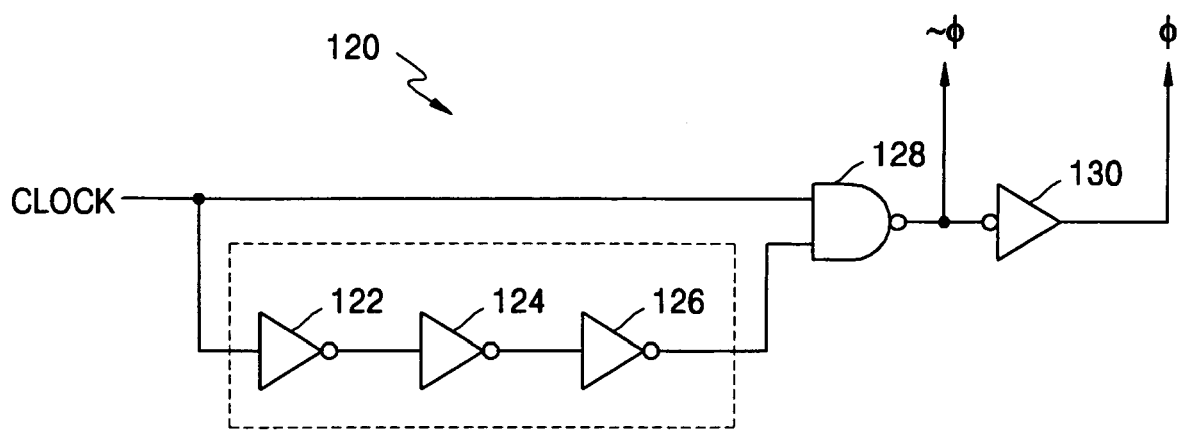
FIG. 2 illustrates a circuit diagram of a conventional pulse generator.

FIGS. 9, 10, 11 and 12 illustrate various examples of a latch that may be used in the pulse-based flip-flop 100 (for example, the one illustrated in FIG. 1).

Figure 9:
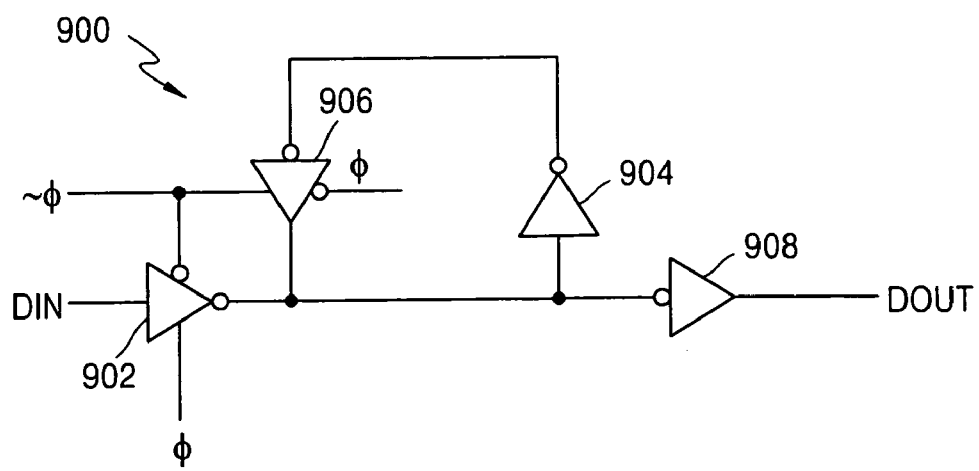
FIGS. 9, 10, 11 and 12 are circuit diagrams illustrating example latches which may be used in the pulse-based flip-flop of FIG. 1.

The latch 900 of FIG. 9 may include a first inverter 902, which may receive a data input signal DIN in response to a first clock pulse signal and a second clock pulse signal ~φ and φ, a second inverter 904, which may receive an output of the first inverter 902, a third inverter 906, which may receive an output of the second inverter 904 in response to the first and second clock pulse signals ~φ and φ, and a fourth inverter 908, which may receive the output of the first inverter 902. An output of the fourth inverter may be outputted as a data output signal DOUT. The output of the second inverter 904 may be connected to the output of the first inverter 902. The latch 900 may output the data input signal DIN as the data output signal DOUT in response to a falling edge of the first clock pulse ~φ and a rising edge of the second clock pulse φ.

Figure 10:
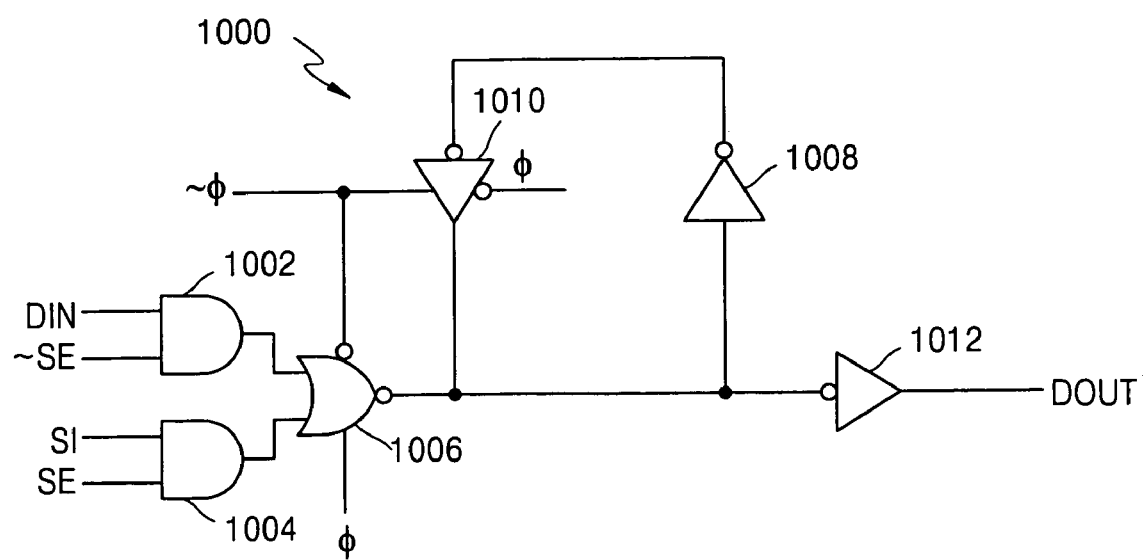

The latch 1000 shown in FIG. 10 may include a first AND gate 1002 for receiving a data input signal DIN and an inverted scan enable signal ~SE, a second AND gate 1004, which may receive a scan input signal SI and a scan enable signal SE, a NOR gate 1006, which may receive an output of the first and second AND gates 1002 and 1004 in response to a first clock pulse and a second clock pulse signal ~φ and φ, a first inverter 1008 which may receive the output of the NOR gate 1006, a second inverter 1010, which may receive an output of the first inverter 1008 in response to the first and second clock pulse signals ~φ and φ, and a third inverter 1012 which may receive the output of the NOR gate 1006 and may output a data output signal DOUT. An output of the second inverter 1010 may be connected to the output of the NOR gate 1006.

The latch 1000, which may receive the scan input signal SI as its input signal when the scan enable signal SE, may be activated at a logic high level, and may receive the data input signal DIN as its input signal when the scan enable signal SE may be inactivated at a logic low level. Then, the latch may output the received input signal as a data output signal DOUT in response to the first clock pulse signal and the second clock pulse signal ~φ and φ.

Figure 11:
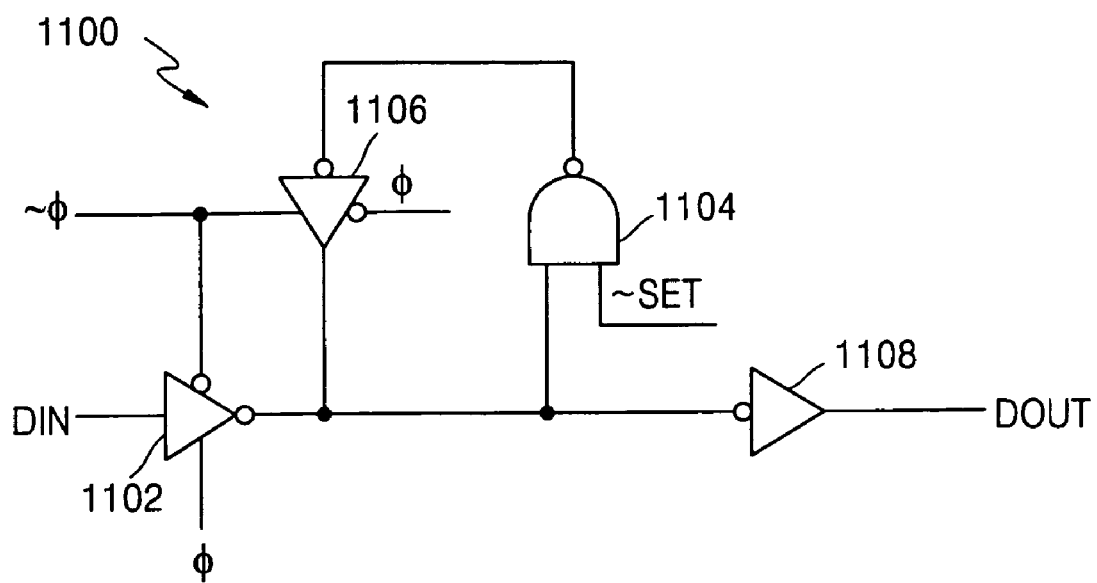

The latch 1100 illustrated in FIG. 11 may include a first inverter 1102 for receiving a data input signal DIN in response to a first clock pulse signal and a second clock pulse signal ~φ and φ, a NAND gate 1104, which may receive an output of the first inverter 1102 and a set signal ~SET as its input signals, a second inverter 1106, which may receive an output of the NAND gate 1104 in response to the first and second clock pulse signals ~φ, and φ and a third inverter 1108, which may receive the output of the first inverter 1102 and may output a data output signal DOUT. An output of the second inverter 1106 may be connected to the output of the first inverter 1102.

The latch 1100 may output the data input signal DIN as the data output signal DOUT in response to the first clock pulse signal and the second clock pulse signal ~φ and φ, when the set signal ~SET may be inactivated at a logic high level, and may set the data output signal DOUT to a logic high level when the set signal ~SET may be activated at a logic low level.

Figure 12:
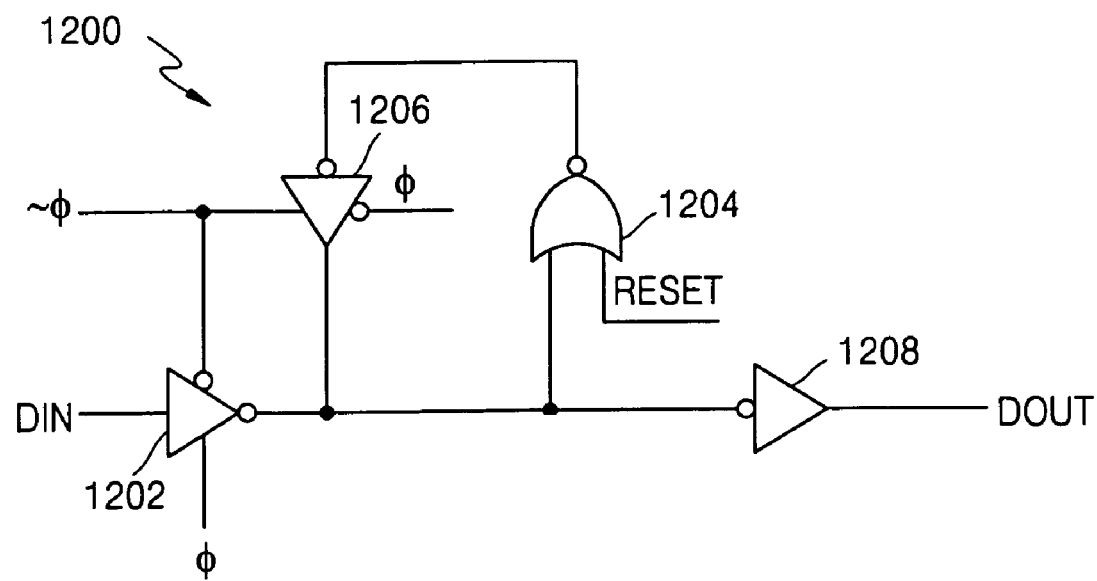

The latch 1200 illustrated in FIG. 12 may include a first inverter 1202 which may receive a data input signal DIN in response to a first clock pulse signal and a second clock pulse signal ~φ and φ, a NOR gate 1204, which may receive an output of the first inverter 1102 and a reset signal RESET as its input signals, a second inverter 1206, which may receive an output signal of the NOR gate 1204 in response to the first and second clock pulse signals ~φ and φ, and a third inverter 1208, which may receive the output signal of the first inverter 1202 and may output a data output signal DOUT. An output of the second inverter 1206 may be connected to the output of the first inverter 1202.

The latch 1200 may output the data input signal DIN as a data output signal DOUT in response to the first clock pulse signal and the second clock pulse signal ~φ and φ, when the reset signal RESET may be inactivated at a logic low level, and may reset the data output signal DOUT to a logic low level when the reset signal RESET may be activated at a logic high level.

Figure 13:
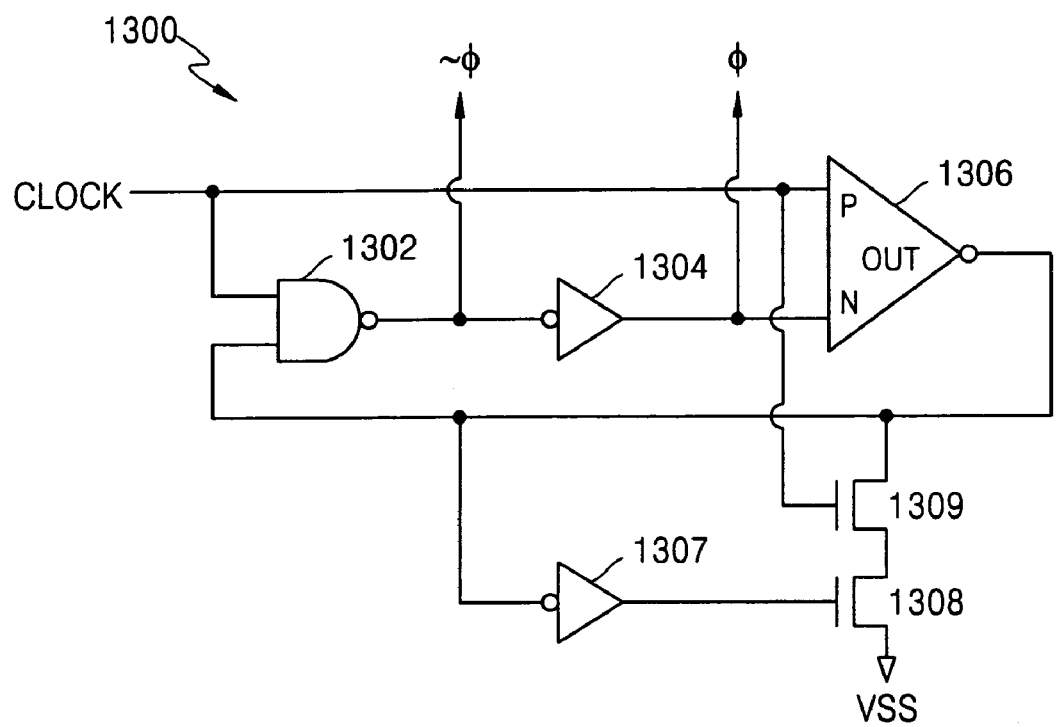
FIG. 13 is a circuit diagram illustrating a pulse generator according to another exemplary embodiment of the present invention.

FIG. 13 illustrates a circuit diagram of a pulse generator 1300 according to another embodiment of the present invention. Referring to FIG. 13, the pulse generator 1300 may be distinguished from the pulse generator 300 of FIG. 3 in that it may further include a second NMOS transistor 1309, which may be connected between an output of a variable delay circuit 1306 and a first NMOS transistor 1308, and gated to a clock signal CLOCK. The second NMOS transistor 1309 may be added to the pulse generator 300 of FIG. 3 in order to prevent a current path to a ground voltage VSS from being formed until the NMOS transistor 308 may be turned off for a period during which the output of the variable delay circuit 1306 may be increased to a logic high level. That is, when the output of the variable delay circuit 1306 may be increased to a logic high level in response to a logic low level of the clock signal CLOCK, the second NMOS transistor 1309 may be turned off to cut off a current path between the output of the variable delay 1306 and the ground voltage VSS.

Figure 14:
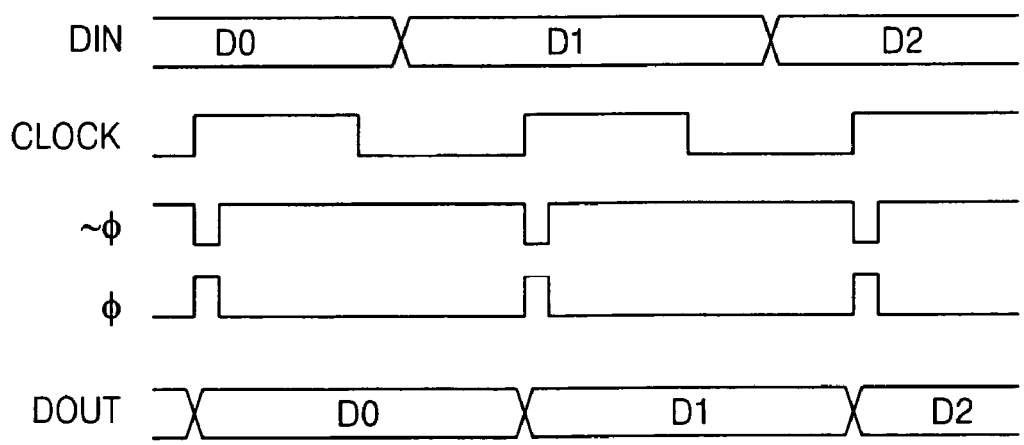
FIG. 14 a timing diagram illustrating an example of a pulse-based flip-flop comprised of the pulse generator of FIG. 3 and the latch of FIG. 9.

FIG. 14 illustrates an operation timing diagram of the pulse-based flip-flop when a first clock pulse signal and a second clock pulse signal ~φ and φ, generated by the pulse generator 300 (illustrated in FIG. 1) according to an exemplary embodiment of the present invention may be applied to the latch 900 illustrated in FIG. 9. A data input signal DIN may be outputted as a data output signal DOUT in response to the first clock pulse signal and second clock pulse signal ~φ and φ both of which may be generated according to a rising edge of the clock signal CLOCK. The operation timing diagram illustration in FIG. 14 may also be applied to the operation of a pulse-based flip-flop comprised of the pulse generator 1300 of FIG. 13 according to another exemplary embodiment of the present invention and the latch 900 of FIG. 9.

Figure 15:
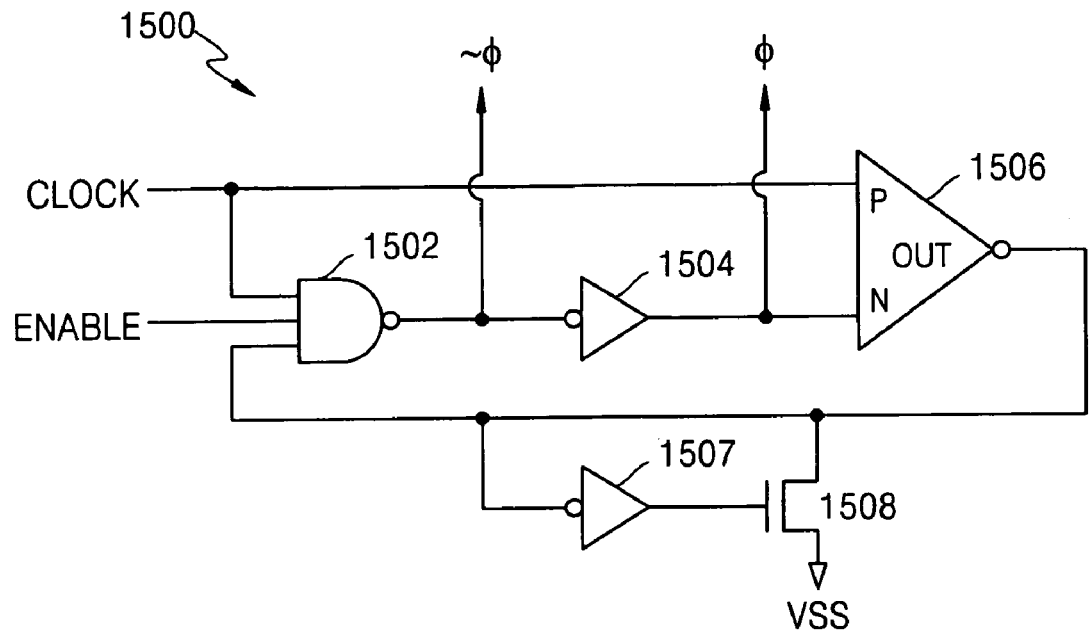
FIG. 15 is a circuit diagram illustrating a pulse generator according to another exemplary embodiment of the present invention.

FIG. 15 illustrates a circuit diagram of a pulse generator 1500 according to another exemplary embodiment of the present invention. The pulse generator 1500 may be operated as the pulse generator 300 of FIG. 3 when an enable signal ENABLE may be activated to a logic high level. The pulse generator 1500 may include a NAND gate 1502 which may receive a clock signal CLOCK, the enable signal ENABLE and an output signal of a variable delay circuit 1506, an inverter 1504, which may receive an output signal of the NAND gate 1502, and the variable delay circuit 1506, which may receive the clock signal CLOCK through an input terminal P, and which may receive an output signal of the inverter 1504 through an input terminal N. The output signal of the NAND gate 1502 may serve as a first clock pulse signal ~φ and an output signal of the inverter 1504 may serve as a second clock signal φ.

The pulse generator 1500 may further include a second inverter 1507, which may receive the output signal of the variable delay circuit 1506, and an NMOS transistor 1508 that may be connected between the output of the variable delay circuit 1506 and a ground voltage VSS, and gated to the output of the second inverter 1507 in order to prevent the output of the variable delay circuit 1506 from floating during a logic high level period of the clock signal CLOCK. It is apparent to those skill in the art that the variable delay circuit 1506 may be replaced with one of the circuits illustrated in FIGS. 4, 5, 6, 7 and/or 8.

Figure 16:
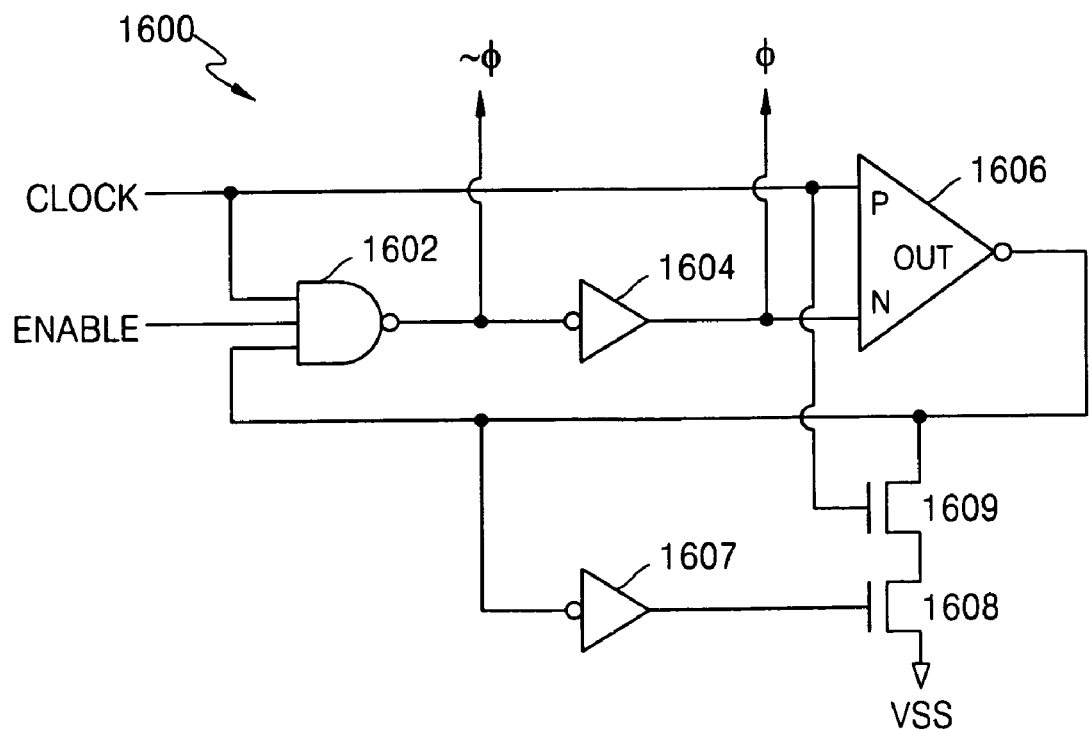
FIG. 16 is a circuit diagram illustrating a pulse generator according to another exemplary embodiment of the present invention.

FIG. 16 illustrates a circuit diagram of a pulse generator 1600 according to another exemplary embodiment of the present invention. The pulse generator 1600 may operate as the pulse generator 1300 of FIG. 13 when an enable signal ENABLE may be activated to a logic high level. The pulse generator 1600 may include a NAND gate 1602, which may receive a clock signal CLOCK, the enable signal ENABLE and an output signal of a variable delay circuit 1606, a first inverter 1604, which may receive an output signal of the NAND gate 1602, and the variable delay circuit 1606, which may receive a clock signal CLOCK through an input terminal P and may receive an output signal of the first inverter 1604 through an input terminal N. The output signal of the NAND gate 1602 may serve as a first clock pulse signal ~φ and the output signal of the inverter 1604 may serve as a second clock pulse signal φ.

The pulse generator 1600 may further include a second inverter 1607, which may receive the output signal of the variable delay circuit 1606, and a first NMOS transistor and a second NMOS transistor 1608 and 1609 both of which may be serially connected between the output of the variable delay circuit 1606 and a ground voltage VSS. A gate of the first NMOS transistor 1608 may be connected to an output of the second inverter 1607 and a gate of the second NMOS transistor 1609 may be connected to the clock signal CLOCK.

Figure 17:
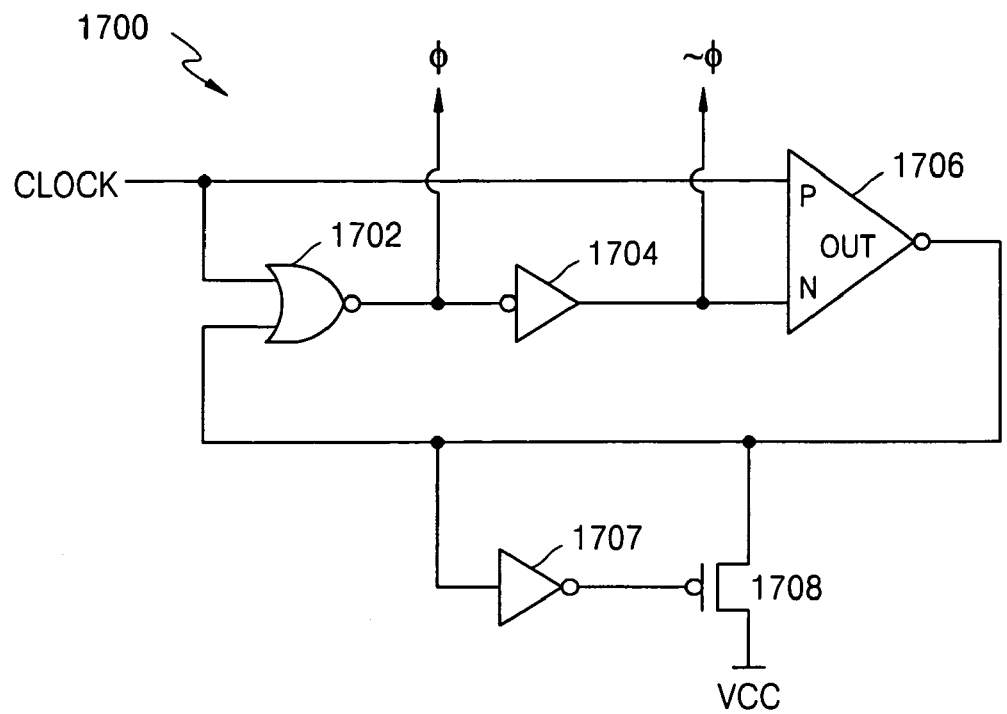
FIG. 17 is a circuit diagram illustrating a pulse generator according to another exemplary embodiment of the present invention.

FIG. 17 illustrates a circuit diagram of a pulse generator 1700 according to another embodiment of the present invention. The pulse generator 1700 may include a NOR gate 1702, which may receive a clock signal CLOCK and an output signal of a variable delay circuit 1706, an inverter 1704, which may receive an output signal of the NOR gate 1702, and the variable delay circuit 1706, which may receive the clock signal CLOCK and an output signal of the inverter 1704. The output signal of the NOR gate 1702 may serve as a first clock pulse signal ~φ and the output signal of the inverter 1704 may serve as a second clock pulse signal φ.

The pulse generator 1700 may further include a PMOS transistor 1708 and a second inverter 1707, which may receive the output signal of the variable delay circuit 1706, a PMOS transistor 1708 that may be connected between the output of the variable delay circuit 1706 and a power supply voltage VCC and gated to an output of the second inverter 1707 in order to prevent the output of the variable delay circuit 1706 from floating during a logic low level period of the clock signal CLOCK.

Figure 18:
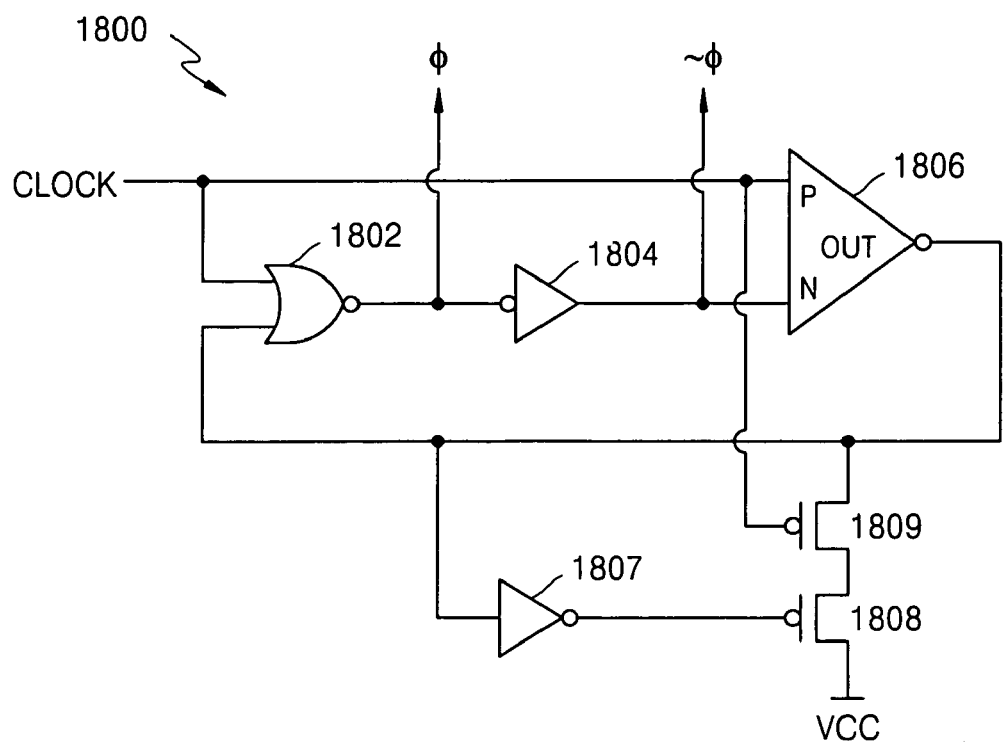
FIG. 18 is a circuit diagram illustrating a pulse generator according to another exemplary embodiment of the present invention.

FIG. 18 illustrates a circuit diagram of a pulse generator 1800 according to another exemplary embodiment of the present invention. The pulse generator 1800 may be distinguished from the pulse generator 1700 of FIG. 17 because it may further include a second NMOS transistor 1809, which may be connected between an output of a variable delay circuit 1806 and a first PMOS transistor 1808, and gated to a clock signal CLOCK. A second PMOS transistor 1809 may be added to the pulse generator 1700 of FIG. 17 in order to prevent a current path from a power supply voltage VCC from being formed until the PMOS transistor 1708, which may be turned off for a period during which the output of the variable delay circuit 1706 may be decreased to a logic low level. That is, when the output of the variable delay circuit 1806 may be decreased to a logic low level in response to a logic high level of the clock signal CLOCK, the second PMOS transistor 1809 may be turned off to cut off a current path between the output of the variable delay circuit 1806 and the power supply voltage VCC.

Figure 19:
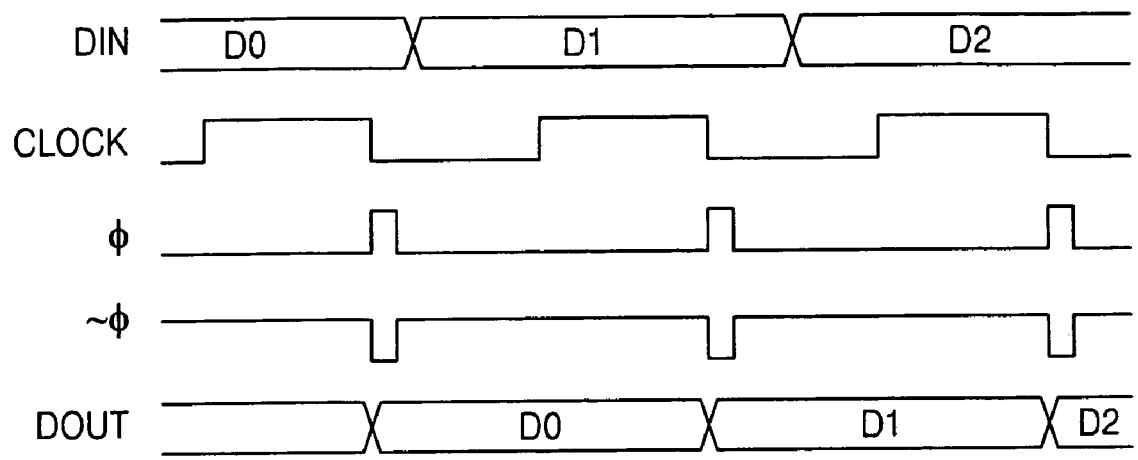
FIG. 19 is an operation timing diagram illustrating an example of a pulse-based flip-flop including the pulse generator of FIG. 17 and the latch of FIG. 9.

FIG. 19 illustrates an operation timing diagram of a pulse-based flip-flop comprised of the pulse generator 1700 of FIG. 17 according to another embodiment of the present invention and the latch 900 of FIG. 9. A data input signal DIN may be outputted as a data output signal DOUT in response to a first clock pulse signal and a second clock pulse signal ~φ and φ that may be generated according to a falling edge of a clock signal CLOCK. The operation timing diagram illustrated in FIG. 19 may also be applied to the operation of a pulse-based flip-flop comprised of the pulse generator 1800 of FIG. 18 according to the exemplary embodiment of the present invention and the latch 900 of FIG. 9.

Figure 20:
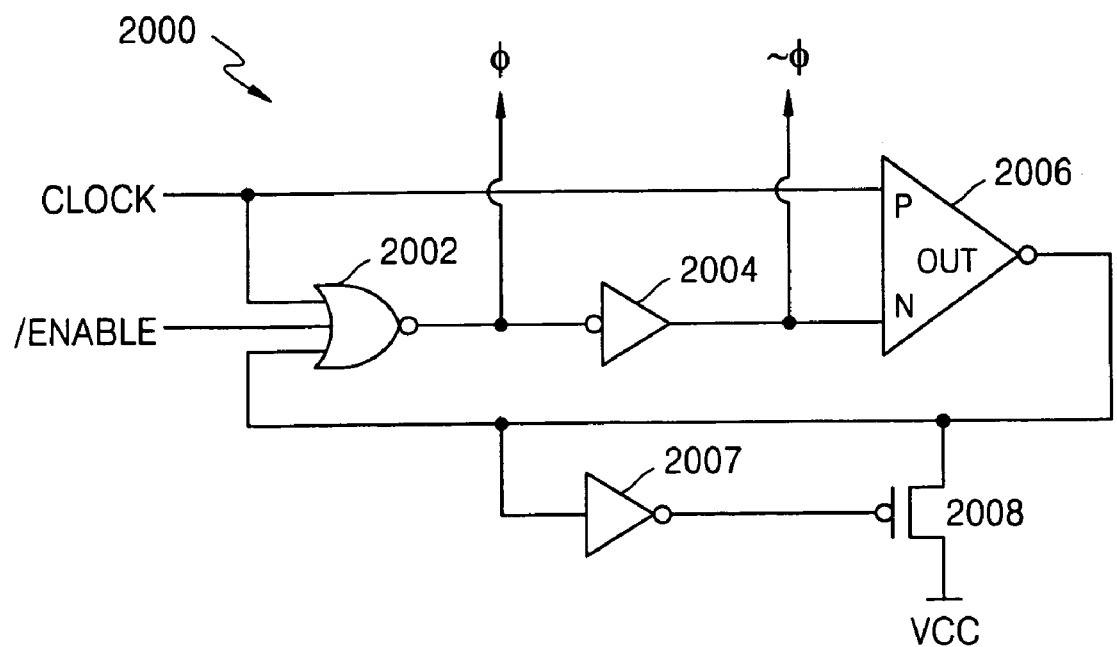
FIG. 20 is a circuit diagram illustrating a pulse generator according to another exemplary embodiment of the present invention.

FIG. 20 illustrates a circuit diagram of a pulse generator 2000 according to another exemplary embodiment of the present invention. The pulse generator 2000 may operate as the pulse generator 1700 of FIG. 17 when an enable signal ENABLE may be activated to a logic low level. The pulse generator 2000 may include a NOR gate 2002 which may receive a clock signal CLOCK, the enable signal ENABLE and an output signal of a variable delay circuit 2006, a first inverter 2004, which may receive an output signal of the NOR gate 2002, and the variable delay circuit 2006 which may receive the clock signal CLOCK through an input terminal P and which may receive an output signal of the first inverter 2004 through an input terminal N. The output signal of the NOR gate 2002 may serve as the a clock pulse signal ~φ, and the output signal of the first inverter 2004 may serve as a second clock pulse signal φ.

The pulse generator 2000 may further include a second inverter 2007, which may receive the output signal of the variable delay circuit 2006, and a PMOS transistor 2008 that may be connected between the output of the variable delay circuit 2006 and a power supply voltage VCC and gated to the output of the second inverter 2007.

Figure 21:
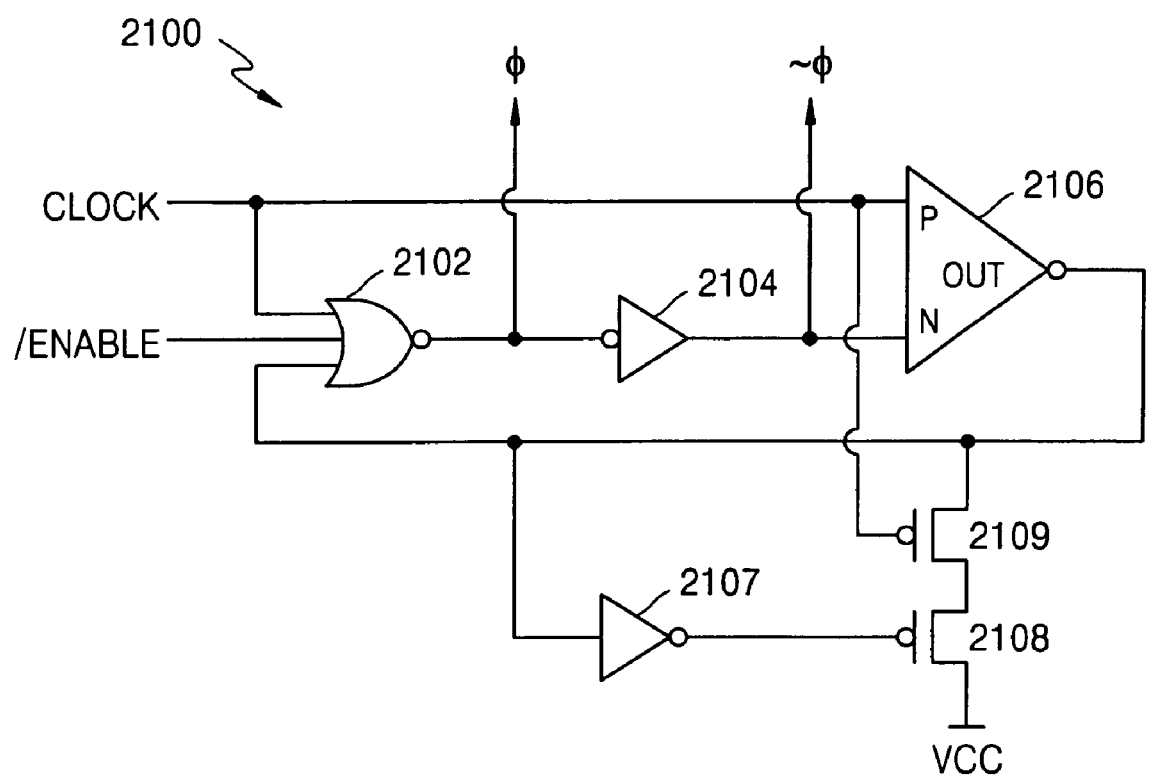
FIG. 21 is a circuit diagram illustrating a pulse generator according to another exemplary embodiment of the present invention.

FIG. 21 illustrates a circuit diagram of a pulse generator 2100 according to another exemplary embodiment of the present invention. The pulse generator 2100 may operate as the pulse generator 1300 of FIG. 13 when an enable signal ENABLE may be activated to a logic high level. The pulse generator 2100 may include a NOR gate 2102 which may receive a clock signal CLOCK, the enable signal ENABLE and an output signal of a variable delay circuit 2106, a first inverter 2104 which may receive an output signal of the NOR gate 2102, and the variable delay circuit 2106 which may receive the clock signal CLOCK through an input terminal P and for receiving an output signal of the first inverter 2104 through an input terminal N. The output signal of the NOR gate 2102 may serve as a first clock pulse signal ~φ, and the output signal of the first inverter 2104 may serve as a second clock pulse signal, φ.

The pulse generator 2100 may further include a second inverter 2107 which may receive an output signal of the variable delay circuit 2106 and a first PMOS transistor and a second PMOS transistor 2108 and 2109 that may be are serially connected between the output of the variable delay circuit 2106 and a power supply voltage VCC. A gate of the first PMOS transistor 2108 may be connected to an output of the second inverter 2107 and a gate of the second PMOS transistor 2109 may be connected to the clock signal CLOCK.

Although FIG. 14 illustrates the operation of a flip-flop comprised of the pulse generator of FIG. 3 and the latch of FIG. 9, and FIG. 19 illustrates the operation of a flip-flop comprised of the pulse generator of FIG. 17 and the latch of FIG. 9, any combination of pulse generators and latches would be apparent to anyone skilled in the art based on the teaching of the preset specifications to construct a flip-flop. In addition, PMOS transistors, NMOS transistors, high and low signals, and logic gates may be substituted with equivalent transistors, low and high signal, and logic gates as would be known to one skilled in the art.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A flip-flop that latches a data input signal to convert the data input signal into a data output signal in response to a clock signal, comprising:
   a latch that latches the data input signal in response to a first clock pulse signal and a second clock pulse signal; and
   a pulse generator including a NAND gate, a variable delay, a first inverter, a second inverter, and a transistor circuit, the pulse generator receives the clock signal to generate the first clock pulse signal and the second clock pulse signal,
   wherein the NAND gate receives the clock signal and an output signal of the variable delay and outputs the first clock pulse signal;
   the first inverter receives the first clock pulse signal and outputs the second clock pulse signal;
   the variable delay receives the clock signal and the second clock pulse signal, and an output signal of the variable delay feeds back to the NAND gate;
   the second inverter receives the output signal of the variable delay; and
   the transistor circuit is connected to the output signal of the variable delay and receives an output of the second inverter.

2. The flip-flop of claim 1, wherein the transistor circuit includes an NMOS transistor having a drain connected to the output signal of the variable delay, a source connected to a ground voltage, and a gate for receiving the output of the second inverter.

3. The flip-flop of claim 1, wherein the transistor circuit includes:
   a first NMOS transistor having a drain connected to the output signal of the variable delay and a gate for receiving the clock signal; and
   a second NMOS transistor having a drain connected to a source of the first NMOS transistor, a gate for receiving the output of the second inverter, and a source connected to a ground voltage.

4. The flip-flop of claim 1 wherein the variable delay includes:
   a PMOS transistor having a source connected to a power supply voltage, a gate for receiving the clock signal, and a drain connected to the output signal; and
   an NMOS transistor having a source connected to a ground voltage, a gate for receiving the second clock pulse signal, and a drain connected to the drain of the PMOS transistor.

5. The flip-flop of claim 1, wherein the variable delay includes:
   a PMOS transistor having a source connected to a power supply voltage, a gate for receiving the clock signal, and a drain connected to the output signal of the variable delay;

a first NMOS transistor having a gate for receiving the power supply voltage and a drain connected to the drain of the PMOS transistor; and a second NMOS transistor having a source connected to a ground voltage, a gate for receiving to the second clock pulse signal, and a drain connected to a source of the first NMOS transistor.

6. The flip-flop of claim 1, wherein the variable delay includes:

a PMOS transistor having a source connected to a power supply voltage and a gate for receiving the clock signal;

an NMOS transistor having a source connected to a ground voltage, a gate for receiving the second clock pulse signal, and a drain connected to a drain of the PMOS transistor;

a third inverter whose input is connected to the drain of the PMOS transistor and the drain of the NMOS transistor; and a fourth inverter for receiving an output of the third inverter and outputting the output signal.

7. The flip-flop of claim 1, wherein the variable delay includes:

a third inverter for receiving the second clock pulse;

a fourth inverter for receiving an output of the third inverter;

a PMOS transistor having a source for receiving a power supply voltage, a gate connected to the clock signal, and a drain connected to the output signal; and an NMOS transistor having a source connected to a ground voltage, a gate for receiving an output of the fourth inverter, and a drain connected to the output signal.

8. The flip-flop of claim 1, wherein the variable delay includes:

a PMOS transistor having a source connected to a power supply voltage, a gate for receiving the clock signal, and a drain connected to the output signal;

a first NMOS transistor having a gate for receiving to the second clock pulse signal and a drain connected to the drain of the PMOS transistor; and a second NMOS transistor having a gate for receiving the second clock pulse signal, a drain connected to a source of the first NMOS transistor, and a source connected to a ground voltage.

9. The flip-flop of claim 1, wherein the latch includes:

a third inverter for receiving the data input signal in response to the first and second clock pulse signals;

a fourth inverter for receiving an output of the third inverter;

a fifth inverter for receiving an output of the fourth inverter in response to the first and second clock pulse signals, an output of the fifth inverter is connected to the output of the third inverter; and a sixth inverter for receiving the output of the third inverter to output a data output signal.

10. The flip-flop of claim 1, wherein the latch includes:

a first AND gate for receiving the data input signal and an inverted scan enable signal;

a second AND gate for receiving a scan input signal and a scan enable signal;

a NOR gate for receiving outputs of the first and second AND gates in response to the first and second clock pulse signals;

a third inverter for receiving an output of the NOR gate;

a fourth inverter for receiving an output of the third inverter in response to the first clock pulse signal and the second clock pulse signal, an output of the fourth inverter is connected to the output of the NOR gate; and a fifth inverter for receiving the output of the NOR gate and outputting the data output signal.

11. The flip-flop of claim 1, wherein the latch includes:

a third inverter for receiving the data input signal in response to the first clock pulse signal and the second clock pulse signal;

a NAND gate for receiving an output of the third inverter and a set signal;

a fourth inverter for receiving an output of the NAND gate in response to the first clock pulse signal and the second clock pulse signal, an output of the fourth inverter is connected to the output of the third inverter; and a fifth inverter for receiving the output of the third inverter to output a data output signal.

12. The flip-flop of claim 1, wherein the latch includes:

a third inverter for receiving the data input signal in response to the first clock pulse signal and the second clock pulse signal;

a NOR gate for receiving an output signal of the third inverter and a reset signal;

a fourth inverter for receiving an output of the NOR gate in response to the first clock pulse signal and the second clock pulse signal, an output of the fourth inverter being connected to the output of the third inverter; and a fifth inverter for receiving the output of the third inverter to output a data output signal.

13. The flip-flop of claim 1, wherein the transistor circuit includes an NMOS transistor having a drain connected to the output signal of the variable delay, a source connected to a ground voltage, and a gate for receiving the output of the second inverter.

14. The flip-flop of claim 1, wherein the transistor circuit includes:

a first NMOS transistor having a drain connected to the output signal of the variable delay and a gate for receiving the clock signal; and a second NMOS transistor having a drain connected to a source of the first NMOS transistor, a gate for receiving the output of the second inverter, and a source connected to a ground voltage.

15. A flip-flop that latches a data input signal to convert the data input signal into a data output signal in response to a clock signal, comprising:

a latch that latches the data input signal in response to a first clock pulse signal and a second clock pulse signal; and a pulse generator including a NAND gate, a variable delay, a first inverter, a second inverter, and a transistor circuit, the pulse generator for receiving the clock signal and an enable signal to generate the first clock pulse signal and the second clock pulse signal, wherein the NAND gate receives the clock signal, the enable signal and an output of the variable delay and outputs the first clock pulse signal;

the first inverter for receiving the output of the NAND gate and outputs the second clock pulse signal;

the variable delay for receiving the clock signal and the second clock pulse signal, and feeds an output signal back to the NAND gate;

the second inverter receives the output signal of the variable delay; and the transistor circuit is connected to the output signal of the variable delay and receives an output of the second inverter.

16. The flip-flop of claim 15, wherein the variable delay includes:
a PMOS transistor having a source connected to a power supply voltage, a gate for receiving the clock signal, and a drain connected to the output signal; and
an NMOS transistor having a source connected to a ground voltage, a gate for receiving the second clock pulse signal, and a drain connected to the drain of the PMOS transistor.

17. The flip-flop of claim 15, wherein the variable delay includes:
a PMOS transistor having a source connected to a power supply voltage, a gate for receiving the clock signal, and a drain connected to the output signal of the variable delay;
a first NMOS transistor having a gate for receiving the power supply voltage and a drain connected to the drain of the PMOS transistor; and
a second NMOS transistor having a source connected to a ground voltage, a gate for receiving the second clock pulse signal, and a drain connected to a source of the first NMOS transistor.

18. The flip-flop of claim 15, wherein the variable delay includes:
a PMOS transistor having a source connected to a power supply voltage and a gate for receiving the clock signal;
an NMOS transistor having a source connected to the ground voltage, a gate for receiving the second clock pulse signal, and a drain connected to a drain of the PMOS transistor;
a third inverter whose input is connected to the drain of the PMOS transistor and the drain of the NMOS transistor; and
a fourth inverter for receiving an output of the third inverter to output an output signal.

19. The flip-flop of claim 15, wherein the variable delay includes:
a third inverter for receiving the second clock pulse signal;
a fourth inverter for receiving an output of the third inverter;
a PMOS transistor having a source connected to the power supply voltage, a gate for receiving the clock signal, and a drain connected to an output signal; and
an NMOS transistor having a source connected to a ground voltage, a gate for receiving the output of the fourth inverter, and a drain connected to the output signal.

20. The flip-flop of claim 15, wherein the variable delay includes:
a PMOS transistor having a source connected to a power supply voltage, a gate for receiving the clock signal, and a drain connected to an output signal;
a first NMOS transistor having a gate for receiving the second clock pulse signal, and a drain connected to the drain of the PMOS transistor; and
a second NMOS transistor having a gate for receiving the second clock pulse signal, a drain connected to a source of the first NMOS transistor and a source connected to a ground voltage.

21. The flip-flop of claim 15, wherein the latch includes:
a third inverter for receiving the data input signal in response to the first and second clock pulse signals;
a fourth inverter for receiving an output of the third inverter;
a fifth inverter for receiving an output of the fourth inverter in response to the first clock pulse signal and the second clock pulse signal, an output of the fifth inverter being connected to the output of the third inverter; and
a sixth inverter for receiving the output of the third inverter to output a data output signal.

22. The flip-flop of claim 15, wherein the latch includes:
a first AND gate for receiving the data input signal and an inverted scan enable signal;
a second AND gate for receiving a scan input signal and a scan enable signal;
a NOR gate for receiving outputs of the first and second AND gates in response to the first clock pulse signal and the second clock pulse signal;
a third inverter for receiving an output of the NOR gate;
a fourth inverter for receiving the output of the third inverter in response to the first clock pulse signal and the second clock pulse signal, an output of the fourth inverter that is connected to the output of the NOR gate; and
a fifth inverter for receiving the output of the NOR gate to output a data output signal.

23. The flip-flop of claim 15, wherein the latch includes:
a third inverter for receiving the data input signal in response to the first clock pulse signal and the second clock pulse signal;
a NAND gate for receiving an output of the third inverter and a set signal;
a fourth inverter for receiving an output of the NAND gate in response to the first clock pulse signal and the second clock pulse signal, an output of the fourth inverter is connected to the output of the third inverter; and
a fifth inverter for receiving the output of the third inverter to output a data output signal.

24. The flip-flop of claim 15, wherein the latch includes:
a third inverter for receiving the data input signal in response to the first clock pulse signal and the second clock pulse signal;
a NOR gate for receiving an output signal of the third inverter and a reset signal;
a fourth inverter for receiving an output of the NOR gate in response to the first clock pulse signal and the second clock pulse signal, an output of the fourth inverter is connected to the output of the third inverter; and
a fifth inverter for receiving the output of the third inverter to output a data output signal.

25. A pulse generator comprising:
a first logic gate for receiving at least one input signal including a clock signal and outputting a first clock pulse of the clock signal;
a first inverter for receiving the first clock pulse of the clock signal and outputting a second clock pulse;
a variable delay for receiving the clock signal and the second clock pulse of the clock signal and outputting a delay for the first clock pulse and the second clock pulse;
a second inverter for receiving the delayed first clock pulse and the delayed second clock pulse; and
at least one transistor for receiving an output of the second inverter and causing both clock pulse signals to occur on an edge of the clock signal and output a final output that is a delay of the input signal.

26. The pulse generator of claim 25, wherein the first logic gate is a NAND gate.

27. The pulse generator of claim 25, wherein the first logic gate is an enabled NAND gate.

28. The pulse generator of claim 25, wherein the first logic gate is a NOR gate.

29. The pulse generator of claim 25, wherein the first logic gate is an enabled NOR gate.

30. The pulse generator of claim 26, wherein the at least one transistor includes an NMOS transistor having a gate connected to an output of the second inverter, a source connected to a ground voltage, and a drain connected to the delayed of the first clock pulse and the delayed of the second clock pulse.

31. The pulse generator of claim 26, wherein the at least one transistor includes:
- a first NMOS transistor having a drain connected to the delayed first clock pulse and the delayed second clock pulse, and a gate connected to the clock signal; and
- a second NMOS transistor having a drain connected to a source of the first NMOS transistor, a gate connected to the output of the second inverter, and a source connected to a ground voltage.

32. The pulse generator of claim 27, wherein the at least one transistor includes an NMOS transistor having a gate connected to an output of the second inverter, a source connected to a ground voltage, and a drain connected to the delayed of the first clock pulse and the delayed of the second clock pulse.

33. The pulse generator of claim 27, wherein the at lease one transistor includes:
- a first NMOS transistor having a drain connected to the delayed first clock pulse and the delayed second clock pulse, and a gate connected to the clock signal; and
- a second NMOS transistor having a drain connected to a source of the first NMOS transistor, a gate connected to the output of the second inverter, and a source connected to a ground voltage.

34. The pulse generator of claim 28, wherein the at least one transistor includes a PMOS transistor having a gate connected to an output of the second inverter, a source connected to a power supply, and a drain connected the delayed first clock pulse and the delayed second clock pulse.

35. The pulse generator of claim 28, wherein the at least one transistor includes:
- a first PMOS transistor having a gate connected to the clock signal, and a drain connected to the delayed first clock pulse and the delayed second clock pulse; and
- a second PMOS transistor having a drain connected to the source of the first PMOS transistor, a gate connected to the output of the second inverter, and a source connected to a power supply.

36. The pulse generator of claim 29, wherein the at least one transistor includes a PMOS transistor having a gate connected to an output of the second inverter, a source connected to a power supply, and drain connected the delayed first clock pulse and the delayed second clock pulse.

37. The pulse generator of claim 29, wherein the at least one transistor includes:
- a first PMOS transistor having a gate connected to the clock signal, and a drain connected to the delayed first clock pulse and the delayed second clock pulse; and
- a second PMOS transistor having a drain connected to the source of the first PMOS transistor, a gate connected to the output of the second inverter, and a source connected to a power supply.

38. A flip-flop including the pulse generator of claim 25.

* * * * *